(12) United States Patent
Jung et al.

(10) Patent No.: US 11,348,715 B2
(45) Date of Patent: May 31, 2022

(54) SEMICONDUCTOR DEVICE AND METHOD OF MAKING THE SAME

(71) Applicant: Samsung Electronics Co., Ltd., Suwon-si (KR)

(72) Inventors: Hong Sik Jung, Newark, CA (US); Xueti Tang, Fremont, CA (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/535,933

(22) Filed: Aug. 8, 2019

(65) Prior Publication Data

US 2020/0388425 A1 Dec. 10, 2020

Related U.S. Application Data

(60) Provisional application No. 62/859,598, filed on Jun. 10, 2019.

(51) Int. Cl.
| | | |
|---|---|---|
| *H01F 10/32* | (2006.01) | |
| *H01L 43/10* | (2006.01) | |
| *H01L 43/12* | (2006.01) | |
| *G11C 11/16* | (2006.01) | |
| *H01L 43/02* | (2006.01) | |
| *H01F 41/32* | (2006.01) | |

(52) U.S. Cl.
CPC ........ *H01F 10/3259* (2013.01); *G11C 11/161* (2013.01); *H01F 10/329* (2013.01); *H01F 10/3286* (2013.01); *H01F 41/32* (2013.01); *H01L 43/02* (2013.01); *H01L 43/10* (2013.01); *H01L 43/12* (2013.01)

(58) Field of Classification Search
None
See application file for complete search history.

(56) References Cited

U.S. PATENT DOCUMENTS

| | | |
|---|---|---|
| 9,425,387 B1 | 8/2016 | Liu et al. |
| 10,522,752 B1 * | 12/2019 | Jan ................. H01F 10/3286 |
| 2012/0205758 A1 | 8/2012 | Jan et al. |
| 2012/0236631 A1 | 9/2012 | Park et al. |
| 2016/0020387 A1 | 1/2016 | Pi et al. |
| 2018/0006213 A1 * | 1/2018 | Park ......................... G11C 11/15 |
| 2018/0269387 A1 | 9/2018 | Iwata et al. |
| 2019/0088856 A1 * | 3/2019 | Yoshikawa ............. H01L 43/10 |
| 2019/0109277 A1 | 4/2019 | Jan et al. |
| 2019/0363244 A1 * | 11/2019 | Sasaki ..................... H01L 43/04 |
| 2020/0098407 A1 * | 3/2020 | Tsai ........................ H01L 27/105 |
| 2020/0357985 A1 * | 11/2020 | Sukegawa ............. H01L 27/105 |

* cited by examiner

*Primary Examiner* — Xiaoming Liu (74) *Attorney, Agent, or Firm* — Lewis Roca Rothgerber Christie LLP (57) ABSTRACT

A perpendicular bottom-free-layer STT-MRAM cell includes a bottom-free-layer magnetic tunnel junction (BMTJ). The BMTJ includes a composite metal oxide seed layer, and a free layer comprising boron (B) on the composite metal oxide seed layer. The composite metal oxide seed layer includes a first metal layer; a metal oxide layer on the first metal layer; and a second metal layer on the metal oxide layer. The second metal layer has been oxygen treated.

20 Claims, 7 Drawing Sheets

SEMICONDUCTOR DEVICE AND METHOD OF MAKING THE SAME

CROSS-REFERENCE TO RELATED APPLICATION

The present application claims priority to and the benefit of U.S. Provisional Application No. 62/859,598, filed on Jun. 10, 2019, the entire content of which is incorporated herein by reference.

FIELD

The present disclosure relates generally to a semiconductor device, in particular, a perpendicular bottom-free-layer STT-MRAM cell with composite metal oxide seed layer, and a method of making the same.

BACKGROUND

Magnetic memories, particularly magnetic random-access memories (MRAMs), have the potential for high read/write speed, high endurance, non-volatility (e.g., persistence), and low power consumption. An MRAM can store information utilizing magnetic materials as an information recording medium. One type of MRAM is a spin-transfer-torque magnetic random-access memory (STT-MRAM). STT-MRAM utilizes magnetic tunnel junctions (MTJs) written at least in part by a current driven through the magnetic junction, which has a tunneling barrier stacked between a free magnetic layer and a pinned (or fixed) magnetic layer. The current affects the magnetic moment of the free layer to be either aligned or anti-aligned with the magnetic moment of the pinned layer (which is unaffected by the current). As the alignment of magnetic moments remains unchanged in the absence of the charge current, the MTJ stack behaves as a bi-stable system suitable for memory storage.

According to the position of the free layer, the MTJs include top-free-layer MTJ (TMTJ) and bottom-free-layer MTJ (BMTJ).

Figure 1:
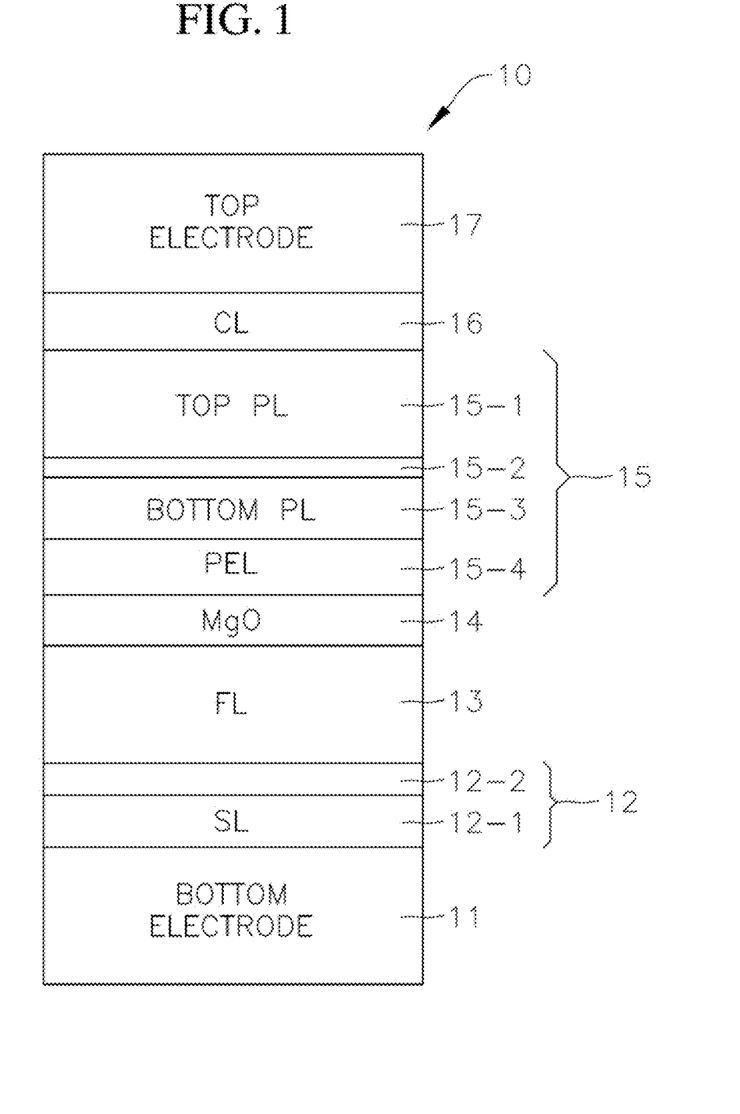
FIG. 1 depicts a comparative bottom-free-layer (or top-pinned-layer) magnetic tunneling junction (BMTJ) 10.

FIG. 1 depicts a comparative bottom-free-layer (or top-pinned-layer) magnetic tunneling junction (BMTJ) 10. The comparative BMTJ 10 is typically disposed on a bottom electrode 11 with a seed layer stack 12, a free layer 13, a main tunneling barrier layer 14, a synthetic antiferromagnetic pinned layer (SAF-PL) stack 15, and a capping layer 16. A top electrode 17 may be in contact with the capping layer 16. The top and bottom electrodes 11 and 17 may be coupled to a selection device (e.g., a transistor). The SAF-PL stack 15 may include a top pinned layer 15-1, a spacer layer 15-2, a bottom pinned layer 15-3, and a polarization enhancing layer (PEL) 15-4. The spacer layer 15-2 provides antiferromagnetic coupling between the top pinned layer 15-1 and the bottom pinned layer 15-3/the PEL 15-4.

In the comparative BMTJ, the free layer 13 is typically formed of a boron (B) containing material, such as FeCoB, and the seed layer stack 12 is typically formed of a thin layer of magnesium oxide (MgO) 12-2 stacked over an amorphous metal layer 12-1. The thin layer of MgO 12-2 typically is about a single layer, is partially crystalized or amorphous and has many pin holes, which leads to less thermal robustness in diffusion and low resistance-area product (RA) compared to the main tunneling barrier 14. It also has relatively low boron (B) affinity towards the boron in the free layer, which leads to more boron accumulated in the MgO-free layer interface, thereby contaminating the MgO-free layer interface. In addition, there is a need to improve the tunnel magnetoresistance (TMR) and Figure-of-Merit (FOM) for the BMTJ.

The above information disclosed in this Background section is only for enhancement of understanding of the background of the invention and therefore it may contain information that does not constitute prior art.

SUMMARY

An aspect of embodiments of the present invention is directed toward a bottom-free-layer STT-MRAM cell with improved tunnel magnetoresistance (TMR) and Figure of Merit (FOM), as well as improved process margin of wafer uniformity in TMR and RA.

Another aspect of embodiments of the present invention is directed toward a method of forming the bottom-free-layer STT-MRAM cell.

According to an embodiment of the present disclosure, a bottom-free-layer magnetic tunnel junction includes a composite metal oxide seed layer, and a free layer comprising boron (B) on the composite metal oxide seed layer, wherein the composite metal oxide seed layer includes a first metal layer; a metal oxide layer on the first metal layer; and a second metal layer on the metal oxide layer, wherein the second metal layer has been oxygen treated.

In an embodiment, the metal oxide layer may include MgO, MgAlO, $MgAl_2O_4$ and/or $(MgAl)_3O_4$.

In an embodiment, the second metal layer may include Nb, Ta, Hf, Zr or Zr—X, wherein X may be Nb, Ta or Hf.

In an embodiment, the second metal layer may include metal-Ox, wherein x represents a molar ratio between oxygen atoms and metal atoms in the second metal layer, and x is less than a value Y, Y being obtained by dividing a valence of the metal atom by 2.

In an embodiment, x may be greater than 0 and less than Y.

In an embodiment, x may be 80% or less of Y.

In an embodiment, the second metal layer may include a metal and the metal of the second metal layer may be partially oxidized.

In an embodiment, the metal oxide layer may include MgO, and the second metal layer may include Nb, Ta, or Hf.

In an embodiment, the metal oxide layer may include $MgAl_2O_4$, and the second metal layer may include Ta, Zr, or Zr—X, wherein X may be Nb, Ta or Hf.

In an embodiment, a thickness of the second metal layer may be about 3.5 Å or less.

In an embodiment, the free layer may include one or more layers selected from FeB, FeB—X, FeCoB, FeCoB—X, Fe, Fe—X, FeCo and FeCo—X, wherein X may be Be, Ni, Mo, Mg, Zr, Ta, V, Cr, W, Hf, Nb, or Tb.

In an embodiment, the first metal layer may include one or more layers selected from Ta, W, Mo, Hf, NiW, NiTa, NiCrW, FeCo—Y, FeCoB, FeCoB—Y, FeB—Y, and CoB—Y, wherein Y may be one or more elements of Ta, Zr, Mo, W, V, or Ni.

According to an embodiment of the present disclosure, a perpendicular bottom-free-layer STT-MRAM cell includes the bottom-free-layer magnetic tunnel junction according to embodiments of the present disclosure.

According to an embodiment of the present disclosure, a method of manufacturing a bottom-free-layer magnetic tunnel junction includes depositing a composite metal oxide seed layer on a bottom electrode, and depositing a free layer comprising boron (B) on the composite metal oxide seed layer, wherein the depositing of the composite metal oxide seed layer includes depositing a first metal layer on the bottom electrode; depositing a metal oxide layer on the first metal layer; depositing a second metal layer on the metal oxide layer; and conducting an oxygen treatment on the second metal layer.

In an embodiment, the conducting of the oxygen treatment may include natural or radical oxidation process.

In an embodiment, the conducting of the oxygen treatment may be conducted at an ambient temperature.

In an embodiment, the conducting of the oxygen treatment may include exposing the metal oxide layer to oxygen prior to the depositing of the second metal layer. In an embodiment, the method may further include conducting annealing after the depositing of the second metal layer to allow oxygen to migrate from the metal oxide layer to the second metal layer.

In an embodiment, the conducting of the oxygen treatment may include exposing the metal oxide layer to oxygen prior to the depositing of the second metal layer; and exposing the second metal layer to oxygen after the depositing of the second metal layer. In an embodiment, the method may further include conducting annealing to allow oxygen to migrate from the metal oxide layer to the second metal layer.

In an embodiment, the method may further include conducting annealing at a temperature of 350° C. to 400° C. after depositing of a main tunneling barrier layer, a polarization enhancing layer or a bottom pinned layer.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

The example embodiments are described in the context of particular magnetic junctions and magnetic memories having certain components. One of ordinary skill in the art will readily recognize that embodiments of the present invention are consistent with the use of magnetic junctions and magnetic memories having other and/or additional components and/or other features not inconsistent with embodiments of the present invention. The method and system are also described in the context of current understanding of spin-orbit interaction, the spin transfer phenomenon, of magnetic anisotropy, and other physical phenomena. Consequently, one of ordinary skill in the art will readily recognize that theoretical explanations of the behavior of the method and system are made based upon this current understanding of spin-orbit interaction, spin transfer, magnetic anisotropy and other physical phenomenon. However, the methods and systems described herein are not dependent upon a particular physical explanation. One of ordinary skill in the art will also readily recognize that the methods and systems are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions, spin-orbit interaction active layers, and/or other structures having particular layers. However, one of ordinary skill in the art will readily recognize that magnetic junctions, spin-orbit interaction active layers, and/or other structures having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions. However, one of ordinary skill in the art will readily recognize that the method and system are consistent with the use of magnetic memories having multiple magnetic junctions. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

According to an embodiment of the present disclosure, a perpendicular bottom-free-layer STT-MRAM cell includes a BMTJ, the BMTJ includes a composite metal oxide seed layer on a bottom electrode; and a free layer including boron (B) on the composite metal oxide seed layer. The composite metal oxide seed layer includes a first metal layer on the bottom electrode, the first metal layer being amorphous; a metal oxide layer on the first metal layer; and a second metal layer on the metal oxide layer, the second metal layer being oxygen treated.

Figure 2:
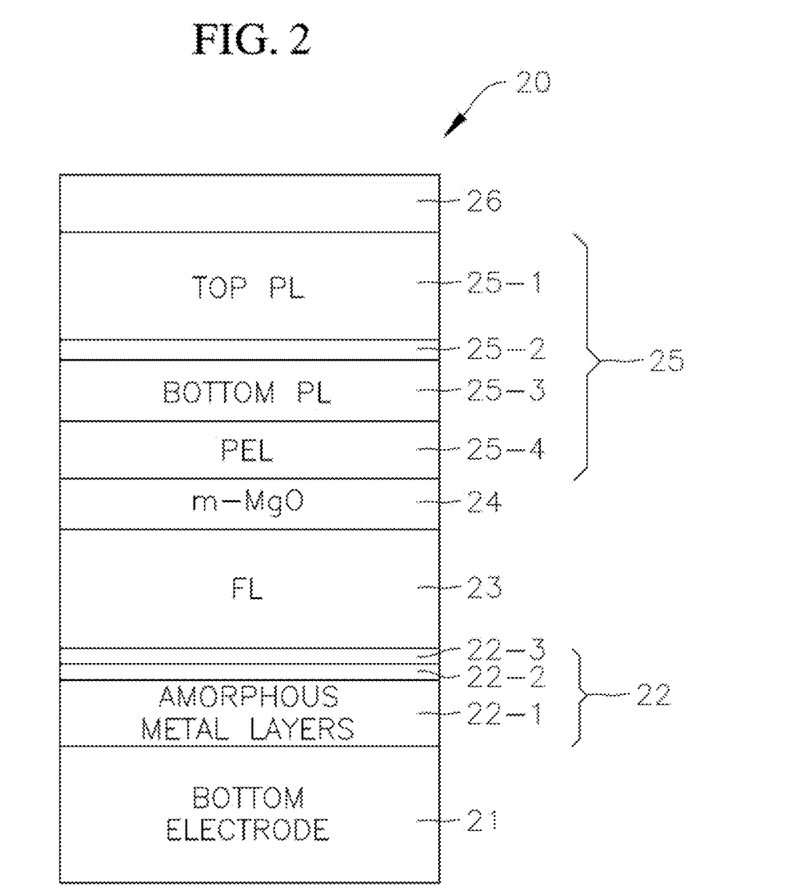
FIG. 2 is a schematic illustration of a bottom-free-layer (or top-pinned-layer) magnetic tunneling junction (BMTJ) 20 according to an embodiment of the present disclosure.

FIG. 2 is a schematic illustration of a bottom-free-layer (or top-pinned-layer) magnetic tunneling junction (BMTJ) 20 according to an embodiment of the present disclosure.

Referring to FIG. 2, a BMTJ 20 is disposed on a bottom electrode 21 with a composite metal oxide seed layer 22; a free layer 23; a main tunneling barrier layer 24; a synthetic antiferromagnetic pinned layer (SAF-PL) stack 25; and a capping layer 26. The SAF-PL stack 25 may include a top pinned layer 25-1; a spacer layer 25-2; a bottom pinned layer 25-3; and a polarization enhancing layer (PEL) including texture breaking layer (TBL) 25-4.

The main tunneling barrier layer 24 may include MgO. The free layer 23 may be a boron (B) containing layer. In one embodiment, the free layer may include one or more layers selected from iron boron (FeB), FeB—X, iron cobalt boron (FeCoB), FeCoB—X, iron (Fe), Fe—X, iron cobalt (FeCo), or FeCo—X, where X is selected from beryllium (Be), nickel (Ni), molybdenum (Mo), magnesium (Mg), zirconium (Zr), tantalum (Ta), vanadium (V), chromium (Cr), tungsten (W), hafnium (Hf), niobium (Nb), and terbium (Tb). For example, the free layer 23 may include iron cobalt boron/iron (FeCoB/Fe).

The composite metal oxide seed layer 22 includes a first metal layer 22-1, the first metal layer 22-1 being amorphous; a metal oxide layer 22-2; and a second metal layer 22-3 which has been oxygen treated. The metal oxide layer 22-2 may include MgO or magnesium aluminum oxide (MgAlO) (e.g., $MgAl_2O_4$, $(MgAl)_3O_4$, spinel oxide with various ratios of Mg and Al, etc.). The metal oxide layer 22-2 may be a partially crystallized or an amorphous layer.

The first metal layer 22-1 is amorphous. In one embodiment, the first metal layer 22-1 may include one or more layers selected from Ta, W, Mo, Hf, NiW, NiTa, NiCrW, FeCo—Y, FeCoB, FeCoB—Y, FeB—Y, and CoB—Y, where Y is one or more elements selected from Ta, Zr, Mo, W, V, and Ni.

In one embodiment, the first metal layer 22-1 may include tantalum/iron cobalt boron tantalum/iron cobalt boron (Ta/FeCoBTa/FeCoB).

The second metal layer 22-3 may include a metal that has high affinity for oxygen and boron. For example, the second metal layer 22-3 may include niobium (Nb), tantalum (Ta), hafnium (Hf) or zirconium (Zr). The second metal layer 22-3 is a thin layer with a thickness of less than 5 angstrom (Å), for example, less than 4 Å. In one embodiment, the second metal layer 22-3 has a thickness of about 3 Å.

The second metal layer 22-3 may be oxygen treated. The oxygen treatment may be an exposure to an oxygen source (e.g., pure oxygen or argon/oxygen mixed gas) in a condition that does not lead to a full oxidization of the metal atoms in the second metal layer 22-3. For example, the exposure to the oxygen source may be only for a short period of time (e.g., less than 1 minute or less than 50 seconds) at a temperature (e.g., at the ambient temperature) that does not lead to the full oxidization. It can be done with natural or radical oxidation processes. As a result, the second metal layer 22-3 is an amorphous layer with an oxygen-rich interface with the free layer 23. Unlike the metal oxide layer 22-2, the second metal layer 22-3 may be a partially oxidized layer and is not a fully oxidized layer. In one embodiment, the second metal layer 22-3 includes both un-oxidized metal atoms and metal atoms bonded to oxygen atoms.

Through the oxygen treatment, oxygen atoms are attached to the metal atoms of the second metal layer 22-3 due to their high affinity for oxygen. The composition of the second metal layer may be represented by metal-Ox. The oxygen atoms retained in the second metal layer 22-3 have high boron affinity. This overcomes the low boron affinity of the metal oxide layer 22-2 and pulls boron to the boron-attracting second metal layer 22-3. Therefore, boron is drawn from the free layer 23 into the composite metal oxide seed layer 22.

In the second metal layer 22-3, the amount of oxygen atoms is lower than the amount of oxygen atoms needed to fully oxidize the metal atoms in the second metal layer 22-3. In other words, the metal atoms of the second metal layer 22-3 are only partially oxidized and are not fully oxidized. For example, the "x" in metal-Ox represents the molar ratio between the oxygen atoms and the metal atoms in the second metal layer 22-3. "x" may be less than a value "Y". "Y" is obtained by dividing the valence of the metal atom by the valence of oxygen atoms (i.e., dividing the valence of the metal atom by 2). In one embodiment, x is about 80% or less, 60% or less, 50% or less, or 30% or less of the value Y.

In one embodiment, the second metal layer 22-3 includes Nb-Ox, and x is less than 1. For example, x is less than or equal to 0.7, 0.5, or 0.3, but is greater than 0. In one embodiment, the second metal layer 22-3 includes Ta-Ox, and x is less than 5/2. For example, x is less than or equal to 2, 1.5, or 1, but is greater than 0. In one embodiment, the second metal layer 22-3 includes Zr-Ox, and x is less than 2. For example, x is less than or equal to 1.5, 1, or 0.5, but is greater than 0. That is, the amount of oxygen atoms in the second metal layer 22-3 is not sufficient to fully oxidize the metal atoms in the second metal layer 22-3 and the second metal layer 22-3 is a partially oxidized layer.

Due to the oxygen rich interface, the second metal layer 22-3 can also reduce or block the metal from the first metal layer 22-1 from diffusing to the free layer 23.

In the BMTJ according to embodiments of the present disclosure, and as described above, the composite metal oxide seed layer 22 will enhance boron migration from the free layer 23 into the composite metal oxide seed layer 22 during in-situ and/or post annealing process. Furthermore, the diffusion of metal (e.g., Ta) from the first metal layer 22-1 into the free layer 23 will be reduced or prevented due to the inclusion of the second metal layer 22-3, which has been oxygen treated. As such, better interface quality between the main tunneling barrier layer 24 and the free layer 23 will also be achieved.

With the inclusion of the amorphous second metal layer 22-3 (which has been oxygen treated), the uniformity of the overall seed layer 22 is improved. For example, in comparison with the conventional pin-hole containing seed layer in which the metal oxide layer (e.g., MgO layer) is in contact with the free layer, the amorphous second metal layer 22-3 improves the uniformity of the interface of the seed layer with the free layer, and also provides an amorphous seed layer rather than the conventional partially crystalized or amorphous MgO seed layer at the interface with the free layer. As a result of the better seed layer quality, higher TMR is achieved. Also, as a result of better free layer quality, lower current density (measured in parallel to reference layer) $Jc_{50\ nm\ PAP}$ is achieved, leading to higher FOM (which is inversely proportional to $Jc_{50\ nm\ PAP}$), representing higher device performance or efficiency.

In one embodiment, the metal oxide layer 22-2 includes MgO, and the second metal layer includes Nb, Ta, or Hf.

In one embodiment, the metal oxide layer 22-2 includes $MgAl_2O_4$, and the second metal layer includes Ta, Zr, or Zr—X, wherein X is Nb, Ta or Hf.

In one embodiment, the thickness of the second metal layer 22-3 is about 3.5 Å or less. In one embodiment, the thickness of the second metal layer is about 2.2 Å.

According to an embodiment of the present disclosure, a method of manufacturing a bottom-free-layer magnetic MTJ (BMTJ) includes depositing a composite metal oxide seed layer on a bottom electrode, and depositing a free layer including boron (B) on the composite metal oxide seed layer. The depositing of the composite metal oxide seed layer includes depositing a first metal layer, the first metal layer being amorphous; depositing a metal oxide layer on the first metal layer; depositing a second metal layer on the metal oxide layer; and conducting an oxygen treatment.

Figure 3:
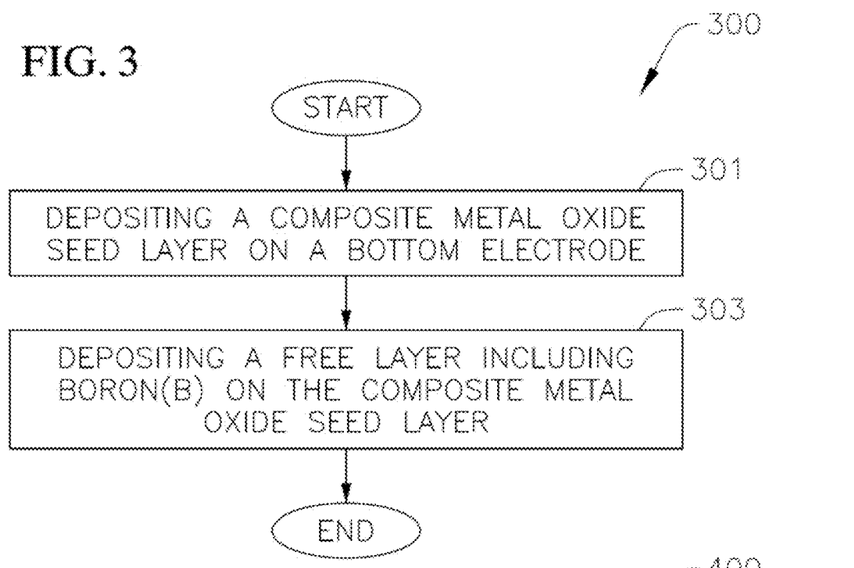
FIG. 3 is a flow chart illustrating a method of manufacturing a BMTJ according to an embodiment of the present disclosure.
Figure 4:
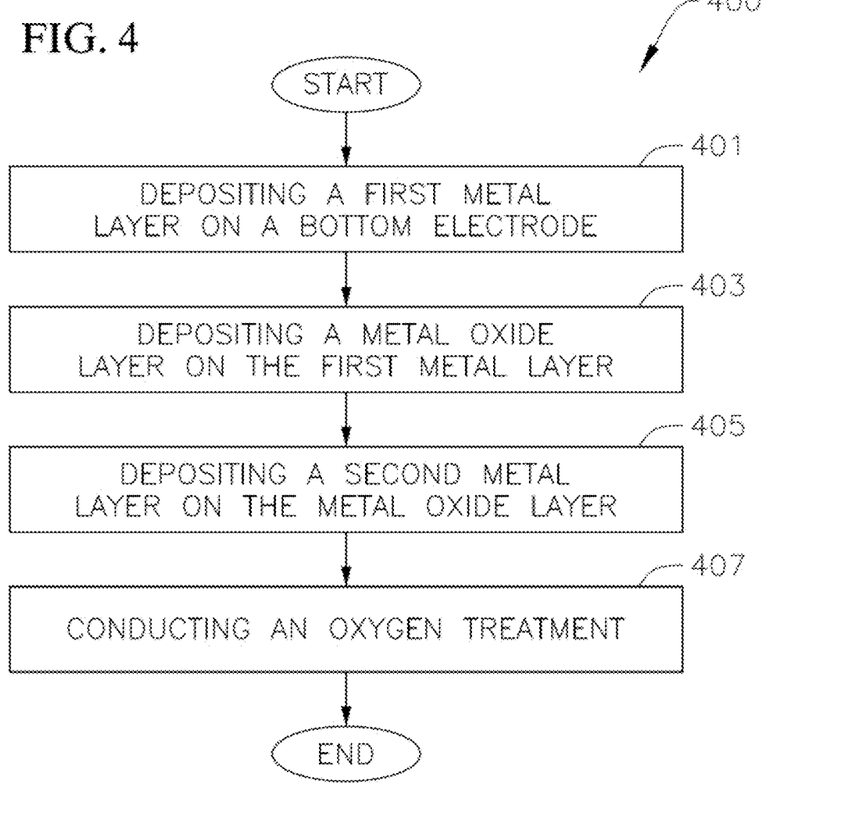
FIG. 4 is a flow chart illustrating a method of depositing the composite metal oxide seed layer according to an embodiment of the present disclosure.

FIG. 3 is a flow chart illustrating a method of manufacturing a BMTJ. Referring to FIG. 3, the method includes depositing a composite metal oxide seed layer on a bottom electrode in act 301, and depositing a free layer including boron (B) on the composite metal oxide seed layer in act 303. FIG. 4 is a flow chart illustrating a method of depositing the composite metal oxide seed layer. Referring to FIG. 4, the method includes depositing a first metal layer on a bottom electrode in act 401, the first metal layer being amorphous; depositing a metal oxide layer on the first metal layer in act 403; depositing a second metal layer on the metal oxide layer in act 405; and conducting an oxygen treatment in act 407.

The depositing of the first metal layer, the metal oxide layer, the second metal layer and the free layer may utilize any suitable method, such as chemical vapor deposition, physical vapor deposition, spin coating, etc.

The free layer may be a boron (B) containing layer. In one embodiment, the free layer may include one or more layers selected from iron boron (FeB), FeB—X, iron cobalt boron (FeCoB), FeCoB—X, iron (Fe), Fe—X, iron cobalt (FeCo) and FeCo—X, where X is selected from beryllium (Be), nickel (Ni), molybdenum (Mo), magnesium (Mg), zirconium (Zr), tantalum (Ta), vanadium (V), chromium (Cr), tungsten (W), hafnium (Hf), niobium (Nb), and terbium (Tb). For example, the free layer may include iron cobalt boron/iron (FeCoB/Fe).

The metal oxide layer may include MgO or magnesium aluminum oxide (MgAlO) (e.g., $MgAl_2O_4$, $(MgAl)_3O_4$, spinel oxide with various ratios of Mg and Al, etc.). The first metal layer is amorphous. In one embodiment, the first metal layer may include one or more layers selected from Ta, W, Mo, Hf, NiW, NiTa, NiCrW, FeCo—Y, FeCoB, FeCoB—Y, FeB—Y, and CoB—Y, where Y is one or more elements selected from Ta, Zr, Mo, W, V, and Ni.

In one embodiment, the first metal layer may include tantalum/iron cobalt boron tantalum/iron cobalt boron (Ta/FeCoBTa/FeCoB).

The second metal layer may include a metal that has high affinity for oxygen and boron. For example, the second metal layer may include niobium (Nb), tantalum (Ta), hafnium (Hf) or zirconium (Zr). The second metal layer is a thin layer with a thickness of less than 5 Å, for example, less than 4 Å. In one embodiment, the second metal layer has a thickness of about 3 Å. The second metal layer may be oxygen treated. The oxygen treatment is an exposure to an oxygen source (e.g., pure oxygen or argon/oxygen mixed gas) for a short period of time (e.g., in less than two minutes, less than 1 minute, or less than 50 seconds). It can be done with natural or radical oxidation processes.

The conducting of the oxygen treatment may be a natural or radical oxidation process. The natural oxidation process may be conducted with a gas-flow mode, a gas-confined mode, etc.

In one embodiment, the conducting of the oxygen treatment is conducted at ambient temperature, e.g., room temperature, such as about 25° C.

In one embodiment, the conducting of the oxygen treatment may include exposing the metal oxide layer to oxygen prior to the depositing of the second metal layer such that oxygen atoms (e.g., additional oxygen atoms in addition to those already bonded to the metal in forming the metal oxide layer) are attached to the metal oxide layer; and annealing the BMTJ stack to allow the additional oxygen atoms to migrate from the metal oxide layer to the second metal layer. The annealing temperature may be about 350° C. to about 400° C. In one embodiment, the annealing may be conducted after the deposition of a main tunneling barrier, PEL or bottom PL.

In one embodiment, the oxygen treatment may be conducted after the deposition of the second metal layer to provide an oxygen-rich metal interface with the free layer.

In one embodiment, the oxygen treatment may be conducted both before and after the deposition of the second metal layer.

In one embodiment, the conducting of the oxygen treatment may include exposing the metal oxide layer to oxygen prior to the depositing of the second metal layer such that additional oxygen atoms are adsorbed to the metal oxide layer; exposing the second metal layer to oxygen after the depositing of the second metal layer; and annealing the BMTJ stack to allow the additional oxygen adsorbed in the metal oxide layer to migrate to the second metal layer.

Through the oxygen treatment, oxygen atoms are attached to the metal atoms of the second metal layer due to the high affinity for oxygen. The second metal layer is amorphous with an oxygen-rich interface with the free layer, and includes metal-Ox. The oxygen atoms retained in the second metal layer has high boron affinity. It overcomes the low boron affinity of the metal oxide layer and pulls boron to the boron attracting second metal layer. Therefore, boron is drawn from the free layer into the composite metal oxide seed layer. However, the amount of oxygen atoms in the second metal layer is below the amount of oxygen needed to fully oxidize the metal atoms in the second metal layer. In other words, the metal atoms of the second metal layer are only partially oxidized and are not fully oxidized. For example, x in metal-Ox represents the molar ratio between the metal atoms and oxygen atoms in the second metal layer, and x is less than a ratio of the valence of the metal atom divided by the valence of oxygen atom.

EXAMPLES

Comparative Example 1

In forming the seed layer, 20 Å of Ta, 40 Å of FeCoBTa, and 5.5 Å of FeCoB (hereinafter referred to as "Ta(20 Å)/FeCoBTa(40 Å)/FeCoB(5.5 Å)") was deposited on a silicon wafer to form the first metal layer, then MgO was sputter deposited at a fixed power first with rotation for 400 seconds (s) to provide a uniformly deposited MgO layer, and without rotation for another 325 s, thereby creating a seed layer with a wedge shaped MgO layer having a thickness varying from thick to thin across the wafer, spanning over 55 mm on each side of the center of the wafer. An average thickness of the MgO seed layer is about 5-11 Å. 8.0 Å of Iron cobalt boron (FeCoB) with 30% boron and 7.5 Å of iron were deposited on the seed layer to form the free layer.

Examples 1 and 2

Examples 1 and 2 were manufactured similarly to Comparative Example 1, except for depositing MgO with rotation for 250 s and without rotation for 250 s, and for including an oxygen treated metal layer between MgO and the free layer. In Example 1, the metal layer includes Nb with a thickness of 2.2 Å, and in Example 2, the metal layer includes Ta with a thickness of 2.2 Å. The Oxygen treatment was conducted for 30 s in each case. Because in Examples 1 and 2, the time for depositing the MgO layer has been shortened compared to that in Comparative Example 1, a thinner MgO layer was deposited in each case.

Comparative Example 2

Comparative Example 2 was manufactured similarly to Comparative Example 1, except that MgO was sputter deposited for 725 s with rotation in forming the seed layer, and a cobalt iron boron layer (with 30% boron and a thickness of about 8 Å) and an iron layer were deposited on the seed layer in forming the free layer. The iron layer was sputtered without rotation to create an iron thickness wedge from 9.5 Å to 5.5 Å across the wafer, spanning over 55 mm on each side of the center of the wafer.

Examples 3 and 4

Examples 3 and 4 were manufactured similarly to Comparative Example 2, except for the amount of time for depositing MgO with rotation was shortened to 430 s, and for including an oxygen treated metal layer between MgO and the free layer. In Example 3, the metal layer includes Nb at 2.2 Å, and in Example 4, the metal layer includes Ta at 2.2 Å. The Oxygen treatment was conducted for 30 s in each case. The MgO thickness is about 7-8 Å for Comparative Example 2 and about 4-6 Å for Examples 3 and 4.

Figure 5:
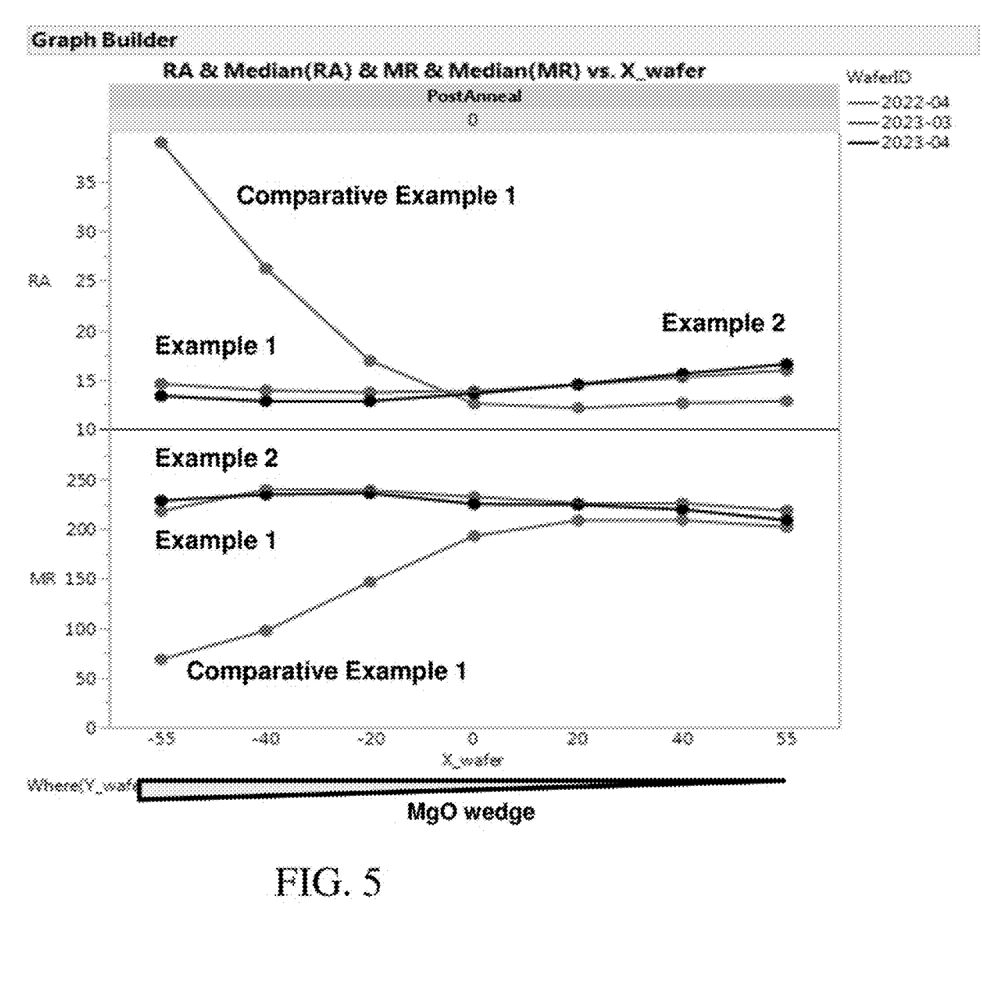
FIG. 5 shows the RA and TMR of Comparative Example 1 and Examples 1 and 2.
Figure 6:
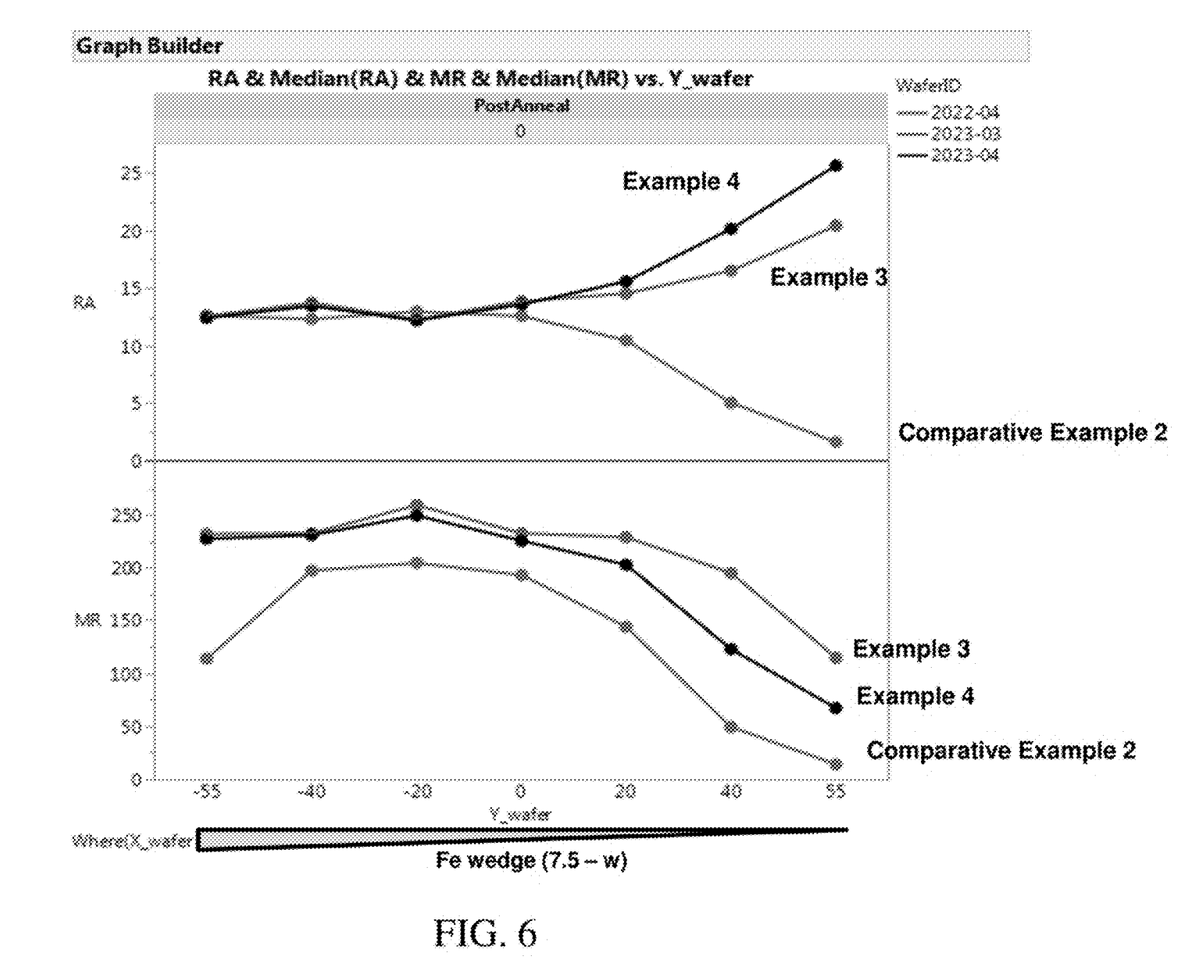
FIG. 6 shows the RA and TMR of Comparative Example 2 and Examples 3 and 4.

FIG. 5 shows the RA and TMR of Comparative Example 1 and Examples 1 and 2. FIG. 6 shows the RA and TMR of Comparative Example 2 and Examples 3 and 4. As can be seen from FIGS. 5-6, the composite MgO and oxygen treated Nb or Ta (hereinafter referred to as "MgO/(Nb, Ta)/OT") seed layer in the Examples improved intrinsic TMR by 30-40% with similar RA compared to the corresponding Comparative Example (representing conventional MgO seed layer). Further, it can be observed that the composite MgO/(Nb, Ta)/OT seed layer in the Examples significantly improved the uniformity of TMR and RA when the thickness of the MgO layer or the free layer varies.

Comparative Example 3

Comparative Example 3 was manufactured similarly to Comparative Example 1, except that MgAlO (instead of MgO) was sputtered uniformly at a fixed power first with rotation for 210 s, and then without rotation for another 180 s, thereby creating a MgAlO seed layer having a thickness varying from thick to thin across a wafer, spanning over 55 mm on each side of the center of the wafer. An average parameters between a seed layer without the oxygen treated second metal layer (referred to as "MgO only") and a seed layer including the oxygen treated second metal layer according to embodiments of the present disclosure.

TABLE 1

| Sample ID | Stack Info | RA | TMR | Hk FL (Oe) | Alpha(1E-3) | ΔHo(Oe) | Kut |
|---|---|---|---|---|---|---|---|
| Comparative Example 5 | MgO only (725 s) | 16.0 | 225 | −1255 | 2.2 | 60 | −0.16 |
| Comparative Example 6 | MgO only (680 s) | 13.0 | 225 | −688 | 3.9 | 172 | −0.09 |
| Example 7 | MgO(470 s)/Nb(2.2)/OT(30 s) | 12.6 | 261 | −723 | 3.2 | 69 | −0.09 |
| Example 8 | MgO(460 s)/Nb(2.2)/OT(30 s) | 12.1 | 261 | −839 | 2.9 | 79 | −0.11 |
| Example 9 | MgO(450 s)/Nb(2.2)/OT(30 s) | 12.5 | 248 | −999 | 3.6 | 109 | −0.12 |
| Example 10 | MgO(440 s)/Nb(2.2)/OT(30 s) | 12.5 | 257 | −1133 | 3.3 | 151 | −0.13 |
| Example 11 | MgO(430 s)/Nb(2.2)/OT(30 s) | 12.5 | 248 | −1345 | 3.3 | 261 | −0.16 | thickness of the MgAlO layer is about 5-11 Å. 8.0 Å of Iron cobalt boron (FeCoB) with 30% boron was deposited and 7.5 Å of iron was deposited on the seed layer to form the free layer.

Example 5

Example 5 was manufactured similarly to Comparative Example 3, except for depositing MgAlO only without rotation for 200 s, and for including a 2.2 Å thick oxygen treated Zr metal layer between MgAlO and the free layer. The Oxygen treatment was conducted for 30 s.

Comparative Example 4

Comparative Example 4 was manufactured similarly to Comparative Example 1, except that MgAlO (instead of MgO) was sputtered uniformly at a fixed power with rotation for 390 s to form the seed layer, and 8.0 Å of Iron cobalt boron (FeCoB) with 30% boron and iron were deposited to form the free layer. The iron layer was deposited without rotation to have a thickness varying from 9.5 Å to 5.5 Å across the wafer, spanning over 55 mm on each side of the center of the wafer.

Example 6

Example 6 was manufactured similarly to Comparative Example 4, except for depositing MgAlO with rotation for 200 s, and for including a 2.2 Å thick oxygen treated Zr metal layer between MgAlO and the free layer. The oxygen treatment was conducted for 30 s.

Figure 7:
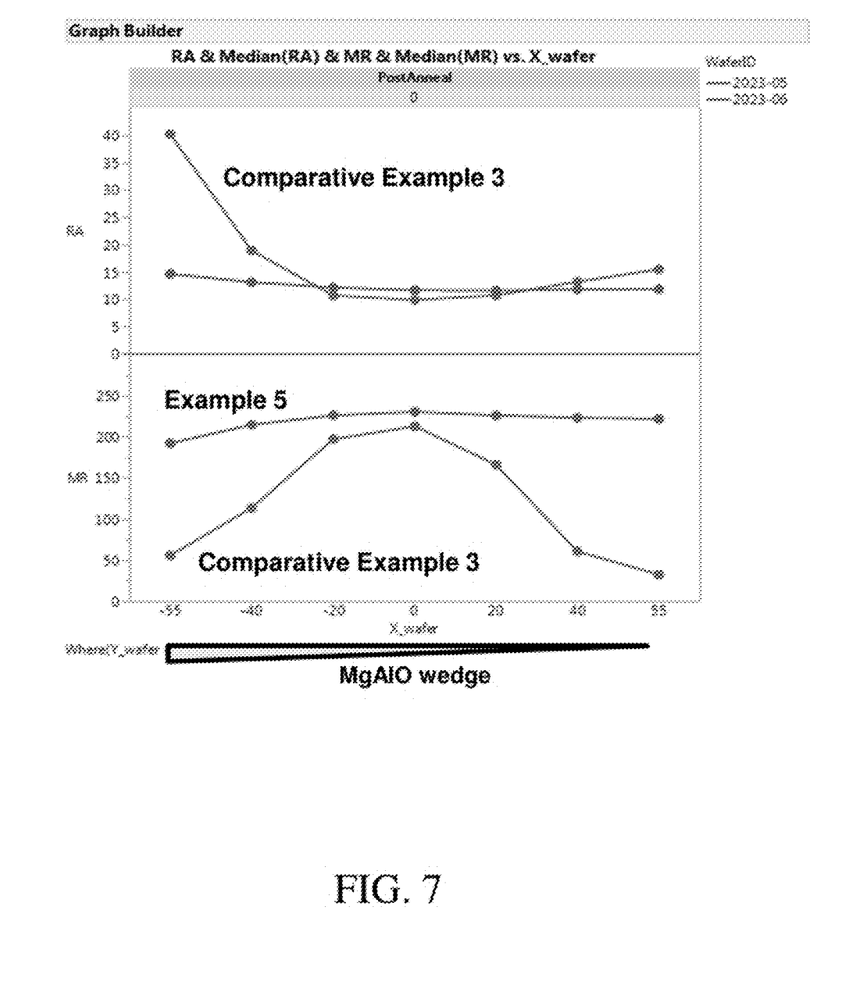
FIG. 7 shows the RA and TMR of Comparative Example 3 and Example 5.
Figure 8:
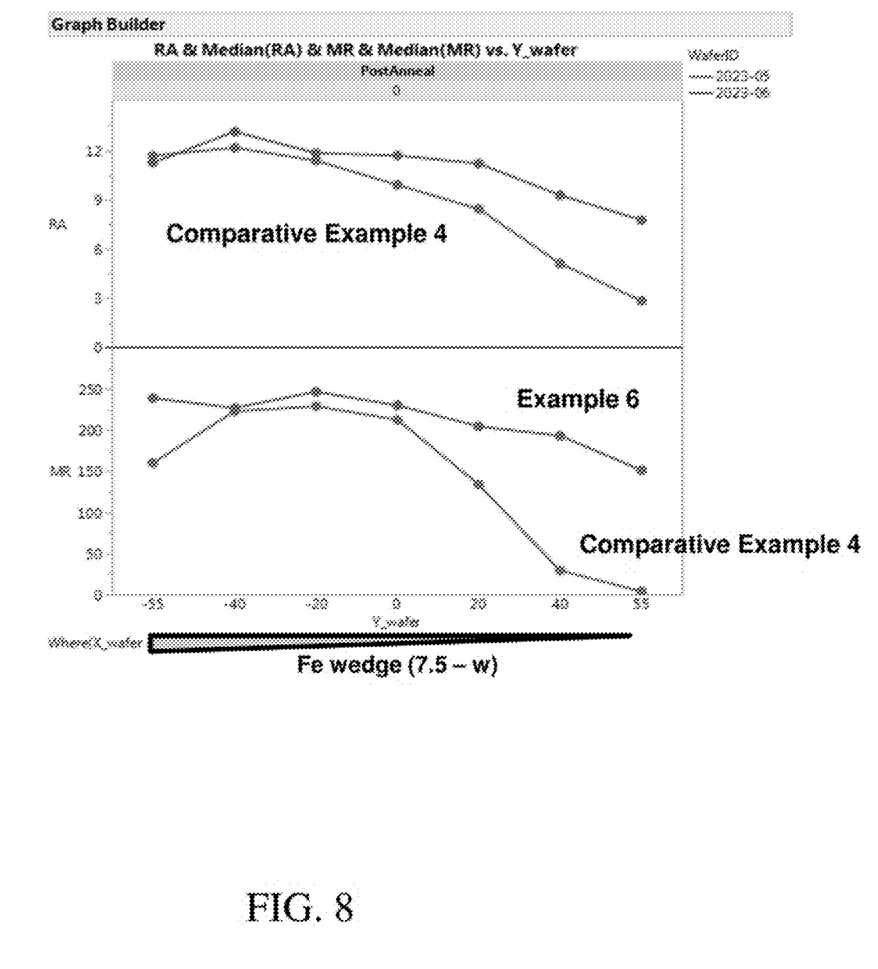
FIG. 8 shows the RA and TMR of Comparative Example 4 and Example 6.

FIG. 7 shows the RA and TMR of Comparative Example 3 and Example 5. FIG. 8 shows the RA and TMR of Comparative Example 4 and Example 6. As can be seen from FIGS. 7-8, the composite MgAlO/Zr/OT (MgAlO and oxygen treated Zr layer) seed layer in the Examples improved intrinsic TMR by 17-60% with similar RA compared to the corresponding Comparative Example (representing conventional MgAlO seed layer). Further, it can be observed that the composite MgAlO/Zr/OT seed layer in the Examples significantly improved the uniformity of TMR and RA when the thickness of the MgAlO layer or the free layer varies.

Comparative Examples 5-6 and Examples 7-11

Comparative Examples 5-6 and Examples 7-11 shown in Table 1 are additional examples showing the difference in In Table 1, the time in seconds following MgO represents the duration for depositing the MgO layer and the time in seconds following OT represents the duration for the oxygen treatment. The thickness of the Nb layer is 2.2 Å.

Table 1 also shows film-level parameters. Hk FL (the effective perpendicular magnetic anisotropy field in a free layer), Alpha (damping constant), and $\Delta H_0$ (inhomogeneous linewidth broadening) were each measured by using ferromagnetic resonance spectroscopy. Negative value of Hk FL indicates perpendicular anisotropy. As can be seen from Table 1, the composite MgO/Nb-Ox seed layer improved Hk FL and Kut (effective magnetic anisotropy constant-free layer thickness product) at similar RA and significantly reduced $\Delta H_0$, indicating less magnetic inhomogeneity while maintaining similar damping constant ($\alpha$) compared to comparative seed layer with MgO only.

It can also be observed from Table 1 that the MgO thickness decreases from Example 7 to Example 11, due to decreased time for depositing the MgO layer. The MgO thickness effect in MgO/Nb-Ox composite seed layer showed trade-off between Hk FL and ΔHo.

Comparative Example 7

A Ta(20 Å)/FeCoBTa(40 Å)/FeCoB(5.5 Å) layer was deposited on a bottom electrode to form a first metal layer, a MgO layer was deposited on the first metal layer to form the metal oxide layer, a FeCoB (8 Å)/Fe(7.5 Å) layer was deposited on the metal oxide layer to form the free layer, a MgO layer of about 10-12 Å thick was deposited on the free layer to form the main tunneling barrier layer, a FeCoB layer of about 12 Å thick was deposited on the main tunneling barrier layer to form a PEL layer, Ta was deposited on the PEL layer to form a texture breaking layer (TBL), Co/Pt multilayers were deposited on the TBL to form the bottom pinned layer, Ir was deposited on the bottom pinned layer to form the spacer layer, Co/Pt multilayers were deposited on the spacer layer to form the second pinned layer, and Ta/Ru were deposited on the second pinned layer to form the capping layer, thereby manufacturing a BMTJ device.

Example 12

A device was manufactured similarly to Comparative Example 7, except for depositing a Nb layer on the MgO seed layer and conducting oxygen treatment for 30 s (referred to as "MgO/Nb/OT"), prior to the deposition of the free layer. The device was annealed at 350 to 400° C. after the deposition of the Nb layer.

Table 2 is a comparison between Comparative Example 7, a device with conventional MgO seed layer and Example 12, a device with the composite oxide MgO/Nb/OT seed layer.

TABLE 2

| Sample ID | SL | RA | TMR | Hc FL (Oe) | Delta 85° C. | $JC_{50\ ns\ P4P}$ | FOM |
|---|---|---|---|---|---|---|---|
| Comparative Example 7 | MgO only | 10 | 185 | 1800 | 80 | 5 | 16.0 |
| Example 12 | MgO/Nb/OT | 10 | 230 | 1500 | 70 | 4 | 17.5 |

As can be seen from Table 2, device data on critical dimension (CD) of about 40 nm with composite MgO/Nb-Ox seed layer clearly showed improved TMR (as shown in the full film data) and improved FOM (=Delta 85° C./$Jc_{50\ ns}$) by reducing $Jc_{50\ ns}$ compared to a device utilizing conventional MgO seed layer. It also shows good thermal stability factor (represented by delta) at 85° C.

While this invention has been described in detail with particular references to exemplary embodiments thereof, the exemplary embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims.

What is claimed is:

1. A bottom-free-layer magnetic tunnel junction comprising:
    a composite metal oxide seed layer, and
    a free layer comprising boron (B) on the composite metal oxide seed layer,
    wherein the composite metal oxide seed layer comprises:
    a first metal layer;
    a metal oxide layer on the first metal layer; and
    a second metal layer on the metal oxide layer, wherein the second metal layer has been oxygen treated,
    wherein the second metal layer comprises Nb, Hf, Zr or Zr—X, wherein X is Nb, Ta or Hf, and
    wherein the first metal layer comprises tantalum/iron cobalt boron tantalum/iron cobalt boron (Ta/FeCoBTa/FeCoB).

2. The bottom-free-layer magnetic tunnel junction of claim 1 wherein the second metal layer is 2.2 Å in thickness.

3. The bottom-free-layer magnetic tunnel junction of claim 1, wherein the metal oxide layer comprises MgO, MgAlO, $MgAl_2O_4$ and/or $(MgAl)_3O_4$.

4. The bottom-free-layer magnetic tunnel junction of claim 1, wherein the second metal layer comprises Nb, Hf, Zr or Zr—X, wherein X is Nb, or Hf.

5. The bottom-free-layer magnetic tunnel junction of claim 1,
    wherein the second metal layer comprises metal-Ox,
    wherein x represents a molar ratio between oxygen atoms and metal atoms in the second metal layer, and x is less than a value Y, Y being obtained by dividing a valence of the metal atom by 2.

6. The bottom-free-layer magnetic tunnel junction of claim 5, wherein x is greater than 0 and less than Y.

7. The bottom-free-layer magnetic tunnel junction of claim 5, wherein x is 80% or less of Y.

8. The bottom-free-layer magnetic tunnel junction of claim 1, wherein the second metal layer comprises a metal and the metal of the second metal layer is partially oxidized.

9. The bottom-free-layer magnetic tunnel junction of claim 1, wherein the metal oxide layer comprises MgO, and the second metal layer comprises Nb or Hf.

10. The bottom-free-layer magnetic tunnel junction of claim 1, wherein the metal oxide layer comprises $MgAl_2O_4$ and the second metal layer comprises Zr, or Zr—X, wherein X is Nb, Ta or Hf.

11. The bottom-free-layer magnetic tunnel junction of claim 1, wherein the free layer comprises one or more layers selected from FeB, FeB—X, FeCoB, FeCoB—X, Fe, Fe—X, FeCo and FeCo—X, wherein X is Be, Ni, Mo, Mg, Zr, Ta, V, Cr, W, Hf, Nb, or Tb.

12. A perpendicular bottom-free-layer STT-MRAM cell, comprising the bottom-free-layer magnetic tunnel junction of claim 1.

13. A method of manufacturing a bottom-free-layer magnetic tunnel junction, the method comprising:
    depositing a composite metal oxide seed layer on a bottom electrode, and
    depositing a free layer comprising boron (B) on the composite metal oxide seed layer;
    wherein the depositing of the composite metal oxide seed layer comprises:
    depositing a first metal layer on the bottom electrode;
    depositing a metal oxide layer on the first metal layer;
    depositing a second metal layer on the metal oxide layer; and
    conducting an oxygen treatment on the second metal layer, and
    wherein the first metal layer comprises tantalum/iron cobalt boron tantalum/iron cobalt boron.

14. The method of claim 13, wherein the conducting of the oxygen treatment comprises natural or radical oxidation process.

15. The method of claim 13, wherein the conducting of the oxygen treatment is conducted at an ambient temperature.

16. The method of claim 13, wherein the conducting of the oxygen treatment comprises exposing the metal oxide layer to oxygen prior to the depositing of the second metal layer.

17. The method of claim 16, further comprising conducting annealing after the depositing of the second metal layer to allow oxygen to migrate from the metal oxide layer to the second metal layer.

18. The method of claim 13, wherein the conducting of the oxygen treatment comprises:
    exposing the metal oxide layer to oxygen prior to the depositing of the second metal layer; and
    exposing the second metal layer to oxygen after the depositing of the second metal layer.

19. The method of claim 18, further comprising conducting annealing to allow oxygen to migrate from the metal oxide layer to the second metal layer.

20. The method of claim 13, further comprising conducting annealing at a temperature of 350° C. to 400° C. after depositing of a main tunneling barrier layer, a polarization enhancing layer or a bottom pinned layer.

* * * * *